(12) United States Patent
Kwon et al.

(10) Patent No.: US 12,236,574 B2
(45) Date of Patent: Feb. 25, 2025

(54) SUBSTRATE TREATING APPARATUS AND SUBSTRATE TREATING METHOD

(71) Applicant: SEMES CO., LTD., Chungcheongnam-do (KR)

(72) Inventors: Ohyeol Kwon, Chungcheongnam-do (KR); Soo Yeon Shin, Gyeonggi-do (KR); Jihyun Lee, Chungcheongnam-do (KR); Chang Yul Cho, Chungcheongnam-do (KR)

(73) Assignee: SEMES CO., LTD., Cheonan-si (KR)

( * ) Notice: Subject to any disclaimer, the term of this patent is extended or adjusted under 35 U.S.C. 154(b) by 341 days.

(21) Appl. No.: 17/461,610

(22) Filed: Aug. 30, 2021

(65) Prior Publication Data

US 2022/0067905 A1 Mar. 3, 2022

(30) Foreign Application Priority Data

Sep. 3, 2020 (KR) ........................ 10-2020-0112191

(51) Int. Cl.
*G06T 7/00* (2017.01)
*G06T 3/10* (2024.01)
(Continued)

(52) U.S. Cl.
CPC ................ *G06T 7/001* (2013.01); *G06T 3/10* (2024.01); *G06T 7/50* (2017.01); *G06T 11/00* (2013.01); *G06T 2207/30148* (2013.01)

(58) Field of Classification Search
CPC ......... G06T 7/00; G06T 7/001; G06T 3/0056; G06T 7/50; G06T 11/00;
(Continued)

(56) References Cited

U.S. PATENT DOCUMENTS 6,551,487 B1 * 4/2003 Reid .................... H01L 21/2885
257/E21.175
6,599,560 B1 * 7/2003 Daggett ............ H01L 21/67253
118/712
(Continued)

FOREIGN PATENT DOCUMENTS

CN 111383194 A * 7/2020 ............. G05T 5/006
JP 2012206093 A 10/2012
(Continued)

*Primary Examiner* — Edward F Urban
*Assistant Examiner* — Benedict E Lee
(74) *Attorney, Agent, or Firm* — Procopio, Cory, Hargreaves & Savitch LLP

(57) ABSTRACT

Disclosed is a substrate treating apparatus. The substrate treating apparatus includes an imaging unit that photographs loci of the one or more discharge liquids discharged from the plurality of nozzles, and an inspection unit that calculates impact points of the one or more discharge liquids discharged from the plurality of nozzles and determines whether the impact points of the one or more discharge liquids discharged from the plurality of nozzles are normal. The inspection unit includes an image synthesizing unit that synthesizes a plurality of images captured by the imaging unit, a pre-processing unit that pre-processes image data generated through the image synthesizing unit, and a calculation unit that calculates whether the impact points of the one or more discharge liquids discharged from the plurality of nozzles are normal by comparing the image data pre-processed by the pre-processing unit.

7 Claims, 7 Drawing Sheets

(51) Int. Cl.
*G06T 7/50* (2017.01)
*G06T 11/00* (2006.01)

(58) Field of Classification Search
CPC .......... G06T 2207/30148; H01L 21/66; H01L 21/67; H01L 21/67023; H01L 21/67253; H01L 21/67051; H01L 22/26; H01L 21/67259; B41J 2/04558; B41J 2/045; B41J 3/46; B41J 29/38
See application file for complete search history.

(56) References Cited

U.S. PATENT DOCUMENTS

| | | | | |
|---|---|---|---|---|
| 8,211,242 B2 * | 7/2012 | Inoue | ................ | H01L 21/67034 |
| | | | | 134/102.2 |
| 9,230,313 B2 * | 1/2016 | Yamazaki | ................ | G06T 5/10 |
| 10,092,933 B2 * | 10/2018 | Kumar | ................ | C25D 21/12 |
| 10,170,344 B2 * | 1/2019 | Ishibashi | ........... | H01L 21/67051 |
| 10,357,806 B2 * | 7/2019 | Kim | ................ | H01L 21/67051 |
| 10,416,091 B2 * | 9/2019 | Wu | ................ | G01N 21/9501 |
| 10,665,481 B2 * | 5/2020 | Sano | ................ | H01L 21/67051 |
| 10,780,692 B2 * | 9/2020 | Ono | ................ | B41J 2/175 |
| 10,811,287 B2 * | 10/2020 | Jeon | ................ | B05C 11/08 |
| 11,145,526 B2 * | 10/2021 | Wang | ................ | H01L 21/67253 |
| 11,217,451 B2 * | 1/2022 | Kosugi | ............. | H01L 21/67028 |
| 11,420,219 B2 * | 8/2022 | Choi | ................ | B05B 12/00 |
| 11,476,129 B2 * | 10/2022 | Hanzlik | ................ | B08B 7/0092 |
| 11,602,901 B2 * | 3/2023 | Mathea | ................ | B29C 64/176 |
| 2015/0231907 A1 * | 8/2015 | Otokita | ................ | B41J 2/175 |
| | | | | 347/10 |
| 2017/0025454 A1 * | 1/2017 | Cheng | ................ | H01L 31/02327 |
| 2017/0186599 A1 * | 6/2017 | Takahashi | ......... | H01L 21/67051 |
| 2017/0225454 A1 * | 8/2017 | Yoshida | ................ | B41J 2/17566 |
| 2018/0021804 A1 * | 1/2018 | Hashimoto | ........... | H01L 21/027 |
| | | | | 427/425 |
| 2021/0320016 A1 * | 10/2021 | Semmelrock | ............. | B08B 3/02 |

FOREIGN PATENT DOCUMENTS

| | | | | |
|---|---|---|---|---|
| JP | 201314029 A | | 1/2013 | |
| KR | 20110013895 A | * | 2/2011 | ....... H01L 21/67051 |
| KR | 1020110013895 A | | 2/2011 | |
| KR | 1020110094043 A | | 8/2011 | |
| KR | 101420159 B1 | * | 7/2014 | ............. G10N 21/85 |
| KR | 101681189 B1 | | 12/2016 | |
| TW | 201517160 A | * | 5/2015 | ....... H01L 21/67051 |

* cited by examiner

SUBSTRATE TREATING APPARATUS AND SUBSTRATE TREATING METHOD

CROSS-REFERENCE TO RELATED APPLICATIONS

A claim for priority under 35 U.S.C. § 119 is made to Korean Patent Application No. 10-2020-0112191 filed on Sep. 3, 2020, in the Korean Intellectual Property Office, the entire contents of which are hereby incorporated by reference.

BACKGROUND

Embodiments of the inventive concept described herein relate to a substrate treating apparatus and a substrate treating method. More particularly, embodiments of the inventive concept relate to an apparatus and a method for identifying whether impact points of discharge liquids discharged from a plurality of nozzles are normal, in a substrate treating apparatus and a substrate treating method for treating a substrate through discharge liquids discharged from a plurality of nozzles to a substrate.

In general, a comparison technique such as template matching is often used as a method for inspecting a location or a state of a moving target. According to the technique, a target that is a reference is photographed by using a vision camera first, and thus a reference image for a reference target is acquired. Thereafter, an image of an inspected object is acquired through photographing of the inspected object and is compared with a reference image, so that it is determined whether a location or a state of the inspected object is normal.

FIG. 1 is a view illustrating an impact point inspecting method in an existing nozzle. Referring to FIG. 1, in a conventional method for inspecting impact points of nozzles, the impact points are inspected by photographing discharge liquids discharged from the nozzles along a reference locus, setting a cross line that crosses the reference locus, and comparing them. Then, in most cases, patterns are formed in an existing wafer. A liquid that flows as in FIG. 1 is discharged to have shapes of water droplets while the discharged water streams failing to maintain their line shapes. When the impact points of the nozzles are inspected by using the conventional method of FIG. 1, borders of the water streams become unclear due to lighting reflected by the patterns of the wafer when the impact points are inspected, so that it is not easy to inspect the impact points.

PRIOR TECHNICAL DOCUMENTS

Patent Documents

Korean Patent No. 10-1420159

SUMMARY

Embodiments of the inventive concept provide a method and an apparatus for inspecting whether impact points of nozzles are normal regardless of existing patterns.

The problems that are to be solved by the inventive concept are not limited to the above-mentioned problems, and the unmentioned problems will be clearly understood by those skilled in the art to which the inventive concept pertains from the specification and the accompanying drawings.

According to an example of the inventive concept, a substrate treating apparatus that treats a substrate through discharge liquids discharged from a plurality of nozzles to a substrate.

According to an embodiment, the substrate treating apparatus includes an imaging unit that photographs loci of the one or more discharge liquids discharged from the plurality of nozzles, and an inspection unit that calculates impact points of the one or more discharge liquids discharged from the plurality of nozzles and determines whether the impact points of the one or more discharge liquids discharged from the plurality of nozzles are normal.

According to an example, the inspection unit may include an image synthesizing unit that synthesizes a plurality of images captured by the imaging unit, a pre-processing unit that pre-processes image data generated through the image synthesizing unit, and a calculation unit that calculates whether the impact points of the one or more discharge liquids discharged from the plurality of nozzles are normal by comparing the image data pre-processed by the pre-processing unit.

According to an example, the image synthesizing unit may synthesize the plurality of images, and may synthesize a maximum brightness value image of the plurality of images.

According to an example, the pre-processing unit may perform distance distortion correction of the image data generated through the image synthesizing unit.

According to an example, the pre-processing unit may detect a shape of the substrate from the image data, on which the distance distortion correction has been performed, and may calculate a center point of the detected shape of the substrate.

According to an example, the pre-processing unit may convert a coordinate system into a polar coordinate system with respect to the center point.

According to an example, the calculation unit may determine whether the nozzles are normal by comparing whether the impact points of the one or more discharge liquids discharged from the plurality of nozzles correspond to ranges of threshold values of the nozzles by using data values obtained in the polar coordinate system.

According to an example, the imaging unit may be disposed at a location, at which the substrate is photographed obliquely.

According to an embodiment, a substrate treating method for treating a substrate by using the substrate treating apparatus is disclosed.

The method may include continuously photographing liquid droplets discharged from a first nozzle and a second nozzle by operating the imaging unit, pre-processing continuously captured images, and determining whether impact points of discharge liquids discharged from the first nozzle and the second nozzle are normal by determining data of the pre-processed images correspond to ranges of threshold values depending on flow rates of the first nozzle and the second nozzle.

According to an example, the continuously photographing of the liquid droplets discharged from the first nozzle and the second nozzle by operating the imaging unit may include synthesizing the continuously captured images, and synthesizing an image obtained by the synthesizing to a maximum bright value.

According to an example, the pre-processing of the continuously captured images may include performing distance distortion correction of data corresponding to the synthesized images.

According to an example, the pre-processing of the continuously captured images may include detecting a shape of the substrate from the data, on which the distance distortion correction is performed, and detecting a center point of the shape of the substrate.

According to an example, the pre-processing of the continuously captured images may include converting a coordinate system into a polar coordinate system with respect to the detected center point.

According to an example, the determining of whether the impact points of the discharge liquids discharged from the first nozzle and the second nozzle are normal by determining the data of the pre-processed images correspond to ranges of threshold values depending on flow rates of the first nozzle and the second nozzle may include determining whether the impact points of the discharge liquids discharged from the first nozzle and the second nozzle are normal by comparing data values in the obtained polar coordinate system and the threshold values depending on the flow rates in the first nozzle and the second nozzle.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
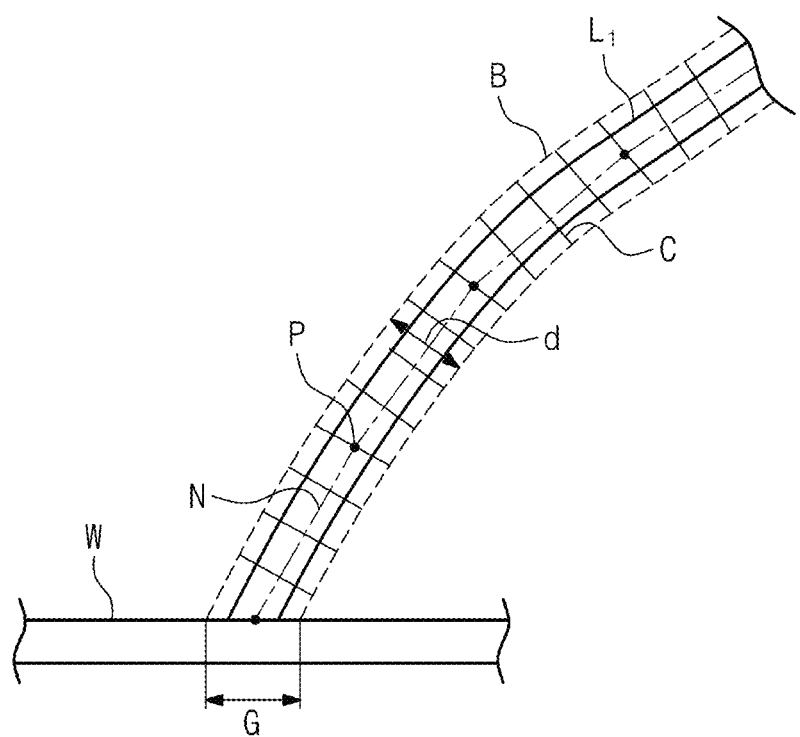
FIG. 1 is a view illustrating an impact point inspecting method in an existing nozzle.

The above and other advantages and features of the inventive concept, and methods of the inventive concept for achieving them will become apparent from the following description of the following embodiments which are given in conjunction with the accompanying drawings and will be described below in detail. However, the inventive concept is not limited by the embodiments disclosed herein but will be realized in various different forms, and the embodiments are provided only to make the disclosure of the inventive concept complete and fully inform the scope of the inventive concept to an ordinary person in the art, to which the inventive concept pertains, and the inventive concept will be defined by the scope of the claims.

Although not defined, all the terms (including technical or scientific terms) used herein may have the same meanings that are generally accepted by the common technologies in the field to which the inventive concept pertains. The terms defined by the general dictionaries may be construed to have the same meanings as those meant in the related technologies and/or the disclosure of the application, and will neither become conceptual nor be construed to be excessively formal even though not clearly defined herein.

The terms such as first and second may be used to describe various elements, but the elements are not limited to the terms. The terms may be used only for the purpose of distinguishing one element from another element. For example, without departing the scope of the inventive concept, a first element may be referred to as a second element, and similarly, a second element may be referred to as a first element.

The terms of a singular form may include plural forms unless otherwise specified. Furthermore, in the drawings, the shapes and sizes of the elements may be exaggerated for clearer description.

The terms used herein are provided to describe the embodiments but not to limit the inventive concept. In the specification, the singular forms include plural forms unless particularly mentioned. The expressions 'include' and/or its various conjugated forms, such as 'including', which are used in the specification do not exclude existence or addition of one or more compositions, substances, elements, steps, operations, and/or devices. In the specification, the term 'and/or' represents enumerated configurations or various combinations thereof.

The term 'unit' used in the entire specification is a unit for processing at least one function or operation, and for example, may refer to a hardware element such as an FPGA or an ASIC. However, the 'unit' is not limited to software or hardware. The 'unit' may be constituted in a storage medium that may perform addressing, and may be configured to reproduce one or more processors.

Accordingly, as an example, the 'unit' may include elements such as software elements, object-oriented software elements, class elements, and task elements, processes, functions, attributes, procedures, sub-routines, segments of a program code, drivers, firmware, micro-codes, circuits, data, a database, data structures, tables, arrays, and parameters. The functions provided by the elements and the 'units' may be separately performed by a plurality of elements and 'units', and may be integrated with other additional elements.

Figure 2:
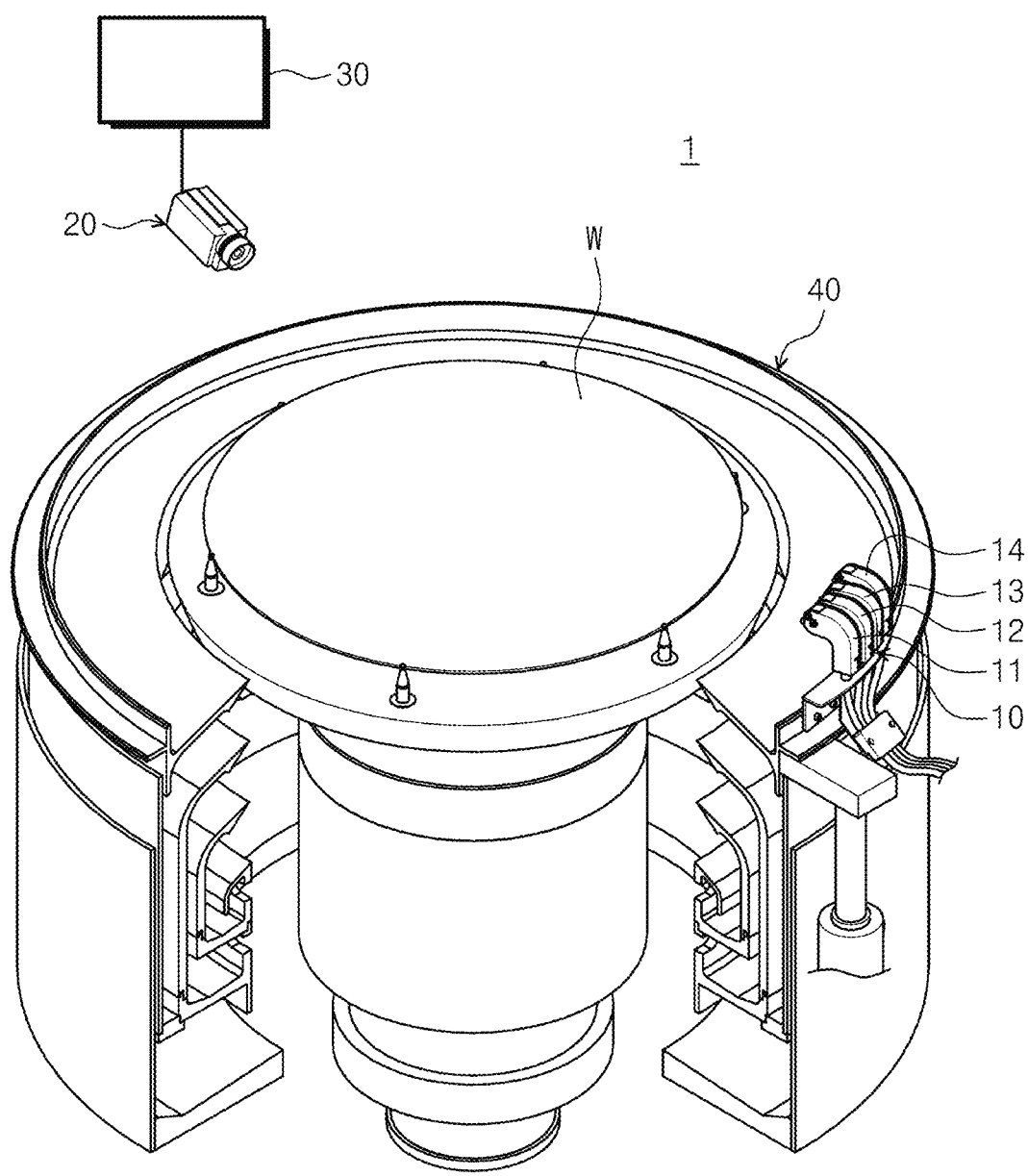
FIG. 2 is a view illustrating a substrate treating apparatus according to an embodiment of the inventive concept.

FIG. 2 is a view illustrating a substrate treating apparatus 1 according to an embodiment of the inventive concept.

The substrate treating apparatus 1 of FIG. 2 may treat a substrate through discharge liquids discharged from a plurality of nozzle discharge holes 11, 12, 13, and 14 to a substrate "W". According to an example, the discharge liquids may be cleaning liquids or chemicals.

According to the substrate treating apparatus 1 according to the inventive concept, a fixed nozzle 10 that discharges a treatment liquid to the substrate "W" may be provided. The fixed nozzle 10 may include the plurality of nozzle discharge holes 11, 12, 13, and 14. According to an example of FIG. 2, an example, in which the fixed nozzle includes four nozzle discharge holes 11, 12, 13, and 14, is disclosed. Although one fixed nozzle 10 is disclosed and a configuration, in which the fixed nozzle 10 includes the plurality of nozzle discharge holes 11, 12, 13, and 14, is disclosed in the embodiment of FIG. 2, this is merely an embodiment, and two fixed nozzles may be disclosed and each of the fixed nozzles may include one nozzle discharge hole.

Hereinafter, the substrate treating apparatus 1, in which one fixed nozzle 10 includes the plurality of nozzle discharge holes 11, 12, 13, and 14, will be described as an example. According to an example, treatment liquids may be discharged from the plurality of nozzle discharge holes 11, 12, 13, and 14. Only some of the plurality of nozzle discharge holes 11, 12, 13, and 14 may discharge the treatment liquids. The treatment liquids may be provided to a surface of the substrate "W".

According to an example, the substrate treating apparatus 1 according to the inventive concept may inspect whether cleaning liquids or chemicals are normally discharged toward target points on the substrate "W". The cleaning liquids and the like will be referred to as 'discharge liquids' in the following. The discharge liquids may be discharged from the fixed nozzle 10 installed on a side surface of the substrate "W" toward the target points while drawing parabolas.

The substrate treating apparatus 1 of FIG. 2 may include a bowl 40 provided to surround the substrate "W".

According to an example, the discharge liquids discharged from the plurality of nozzle discharge holes 11, 12, 13, and 14 included in the fixed nozzle 10 have to be seated at specific locations according to specific loci. However, due to various factors, impact points on the substrate may become different as the loci of the discharge liquids become different. In order to determine this, the substrate treating apparatus 1 may include an imaging unit 20 and an inspection unit 30.

The imaging unit 20 may photograph the discharge liquids discharged from the fixed nozzle 10. According to an example, the imaging unit 20 may be a vision camera. The imaging unit 20 may perform photographing at a location, at which the substrate "W" may be viewed as a whole. The imaging unit 20 may be located at a corner of a chamber, at which the substrate "W" may be viewed as a whole. According to an example, the imaging unit 20 may photograph the substrate "W" and the discharge liquids discharged to the substrate "W" in real time. The imaging unit 20 may photograph the loci of one or more discharge liquids discharged from the plurality of nozzle discharge holes included in the fixed nozzle 10.

The inspection unit 30 may be connected to the imaging unit 20 to inspect whether the impact points of the discharge liquids discharged from the fixed nozzle 10 are normal by using an image captured by the imaging unit 20. Hereinafter, the inspection unit 30 will be described in detail with reference to FIG. 3.

In the embodiment of FIG. 2, it is illustrated that the imaging unit 20 and the inspection unit 30 have separate configurations, but according to another example, the configurations may be embedded in one chamber.

Figure 3:
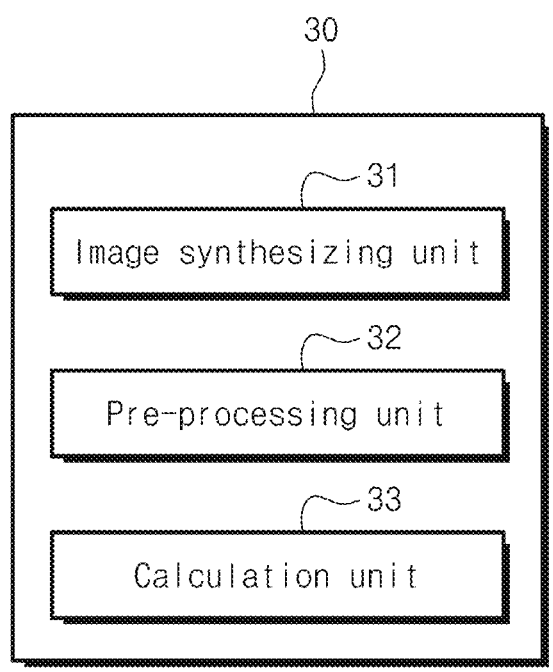
FIG. 3 is a block diagram illustrating a configuration of an inspection unit according to an embodiment of the inventive concept.

FIG. 3 is a block diagram illustrating a configuration of the inspection unit 30 according to an embodiment of the inventive concept.

The inspection unit 30 may calculate the impact points of the one or more discharge liquids discharged from the plurality of nozzle discharge holes and determine whether the impact points of the one or more discharge liquids discharged from the plurality of nozzle discharge holes are normal. The inspection unit 30 according to the inventive concept may include an image synthesizing unit 31, a pre-processing unit 32, and a calculation unit 33.

The image synthesizing unit 31 according to the inventive concept may synthesize a plurality of images captured by the imaging unit 20. The image synthesizing unit 31 may image the substrate and the loci of the discharge liquids discharged from the plurality of nozzles by synthesizing the plurality of images and synthesizing a maximum brightness value image of the plurality of images. According to an example, the image synthesizing unit 31 may synthesize the plurality of images captured continuously. According to an example, the image synthesizing unit 31 may synthesize six or more images captured continuously.

The pre-processing unit 32 according to the inventive concept may pre-process image data generated through the image synthesizing unit 31. The pre-processing may be a data correcting operation that is performed such that comparison may be made more easily in a process of identifying whether the impact points of the discharge liquids discharged from the nozzle discharge holes are normal by using the image synthesized by the image synthesizing unit 31.

The pre-processing unit 32 according to the inventive concept may perform distance distortion correction of the image data generated through the image synthesizing unit 31. The shape of the substrate captured obliquely may be corrected in a form of a circle through the distance distortion correction. The pre-processing unit 32 may detect the shape of the substrate from the data, on which the distance distortion correction has been performed, and may calculate a center point of the detected shape of the substrate. Furthermore, the pre-processing unit 32 may perform the pre-processing by converting a coordinate system into a polar coordinate system with respect to the center point of the shape of the substrate.

The comparison may be easily made by performing the comparison of the impact points and the pre-processing operation for calculation through the pre-processing unit 32.

The calculation unit 33 according to the inventive concept may calculate whether the impact points of the discharge liquids discharged from the plurality of nozzles are normal by comparing the data processed by the pre-processing unit 32. According to an example, the calculation unit 33 may determine whether the nozzles are normal by comparing whether the impact points of the one or more discharge liquids discharged from the plurality of nozzles correspond to ranges of threshold values of the nozzles by using data values obtained in the polar coordinate system. The threshold value ranges of the nozzles may be ranges of values that are determined in consideration of flow rate values in the nozzles and locations of the loci according to the flow rate values. Through this, it may be determined whether the nozzles are normal by identifying and determining whether angles of the impact points of the discharge liquids discharged from the nozzles are accurate.

Figure 4:
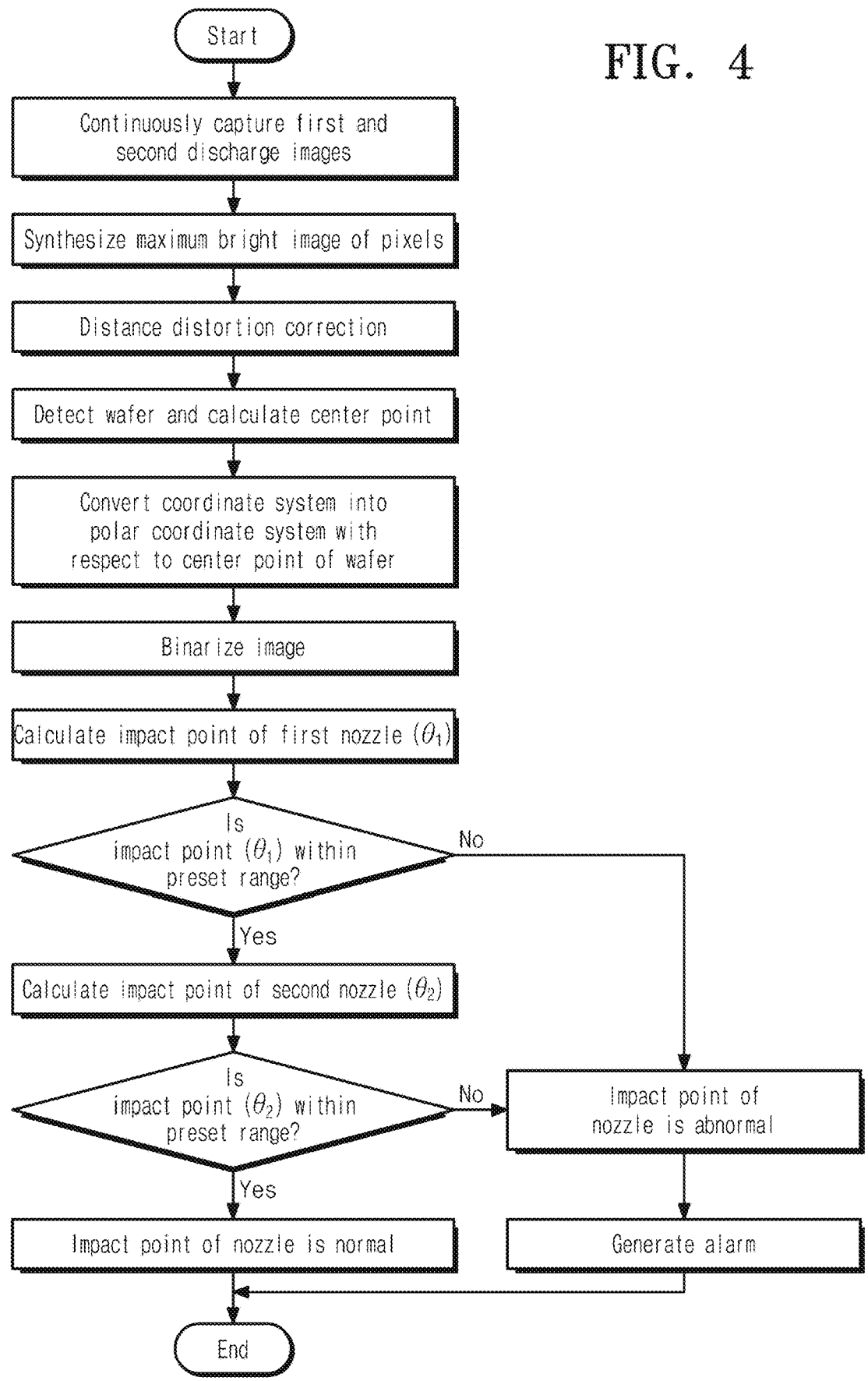
FIG. 4 is a view illustrating a flowchart of a substrate treating method according to an embodiment of the inventive concept.

FIG. 4 is a view illustrating a flowchart of a substrate treating method according to an embodiment of the inventive concept.

Referring to FIG. 4, in a substrate treating method according to an embodiment of the inventive concept, the plurality of nozzle discharge holes included in the fixed nozzle 10 discharge the treatment liquids, which are photographed. The imaging unit 20 that performs photographing may photograph the substrate and the loci of the discharge liquids as a whole, which may be photographed continuously.

A maximum brightness image may be synthesized by using the captured continuous images, and primary pre-processing may be performed by performing the distance distortion correction on the image having the maximum bright value. After the shape of the substrate is detected from the image, on which the distance distortion correction has been performed, the center point of the shape of the substrate may be calculated, and second pre-processing may be performed through conversion of the coordinate system into the polar coordinate system with respect to the center point. Thereafter, the image, on which the pre-processing has been completed, may be binarized, and the impact points of the discharge liquids discharged from the nozzles may be derived through angle values. After specific threshold values are provided depending on the flow rates of the discharge liquids discharged from the nozzles and the derived angle values and the threshold values are compared, and it is determined that the impact points of the discharge liquids discharged from the nozzles are normal when the comparison result are within a specific range, and it is determined that the impact points of the discharge liquids discharged from the nozzles are abnormal when the comparison result are outside the specific range and an alarm may be generated. Through this, the nozzle corresponding to the abnormal impact point may be identified, and a following measure may be taken.

FIGS. 5 to 9 are views illustrating respective operations of inspecting impact points of discharge liquids discharged from a plurality of nozzles.

Figure 5:
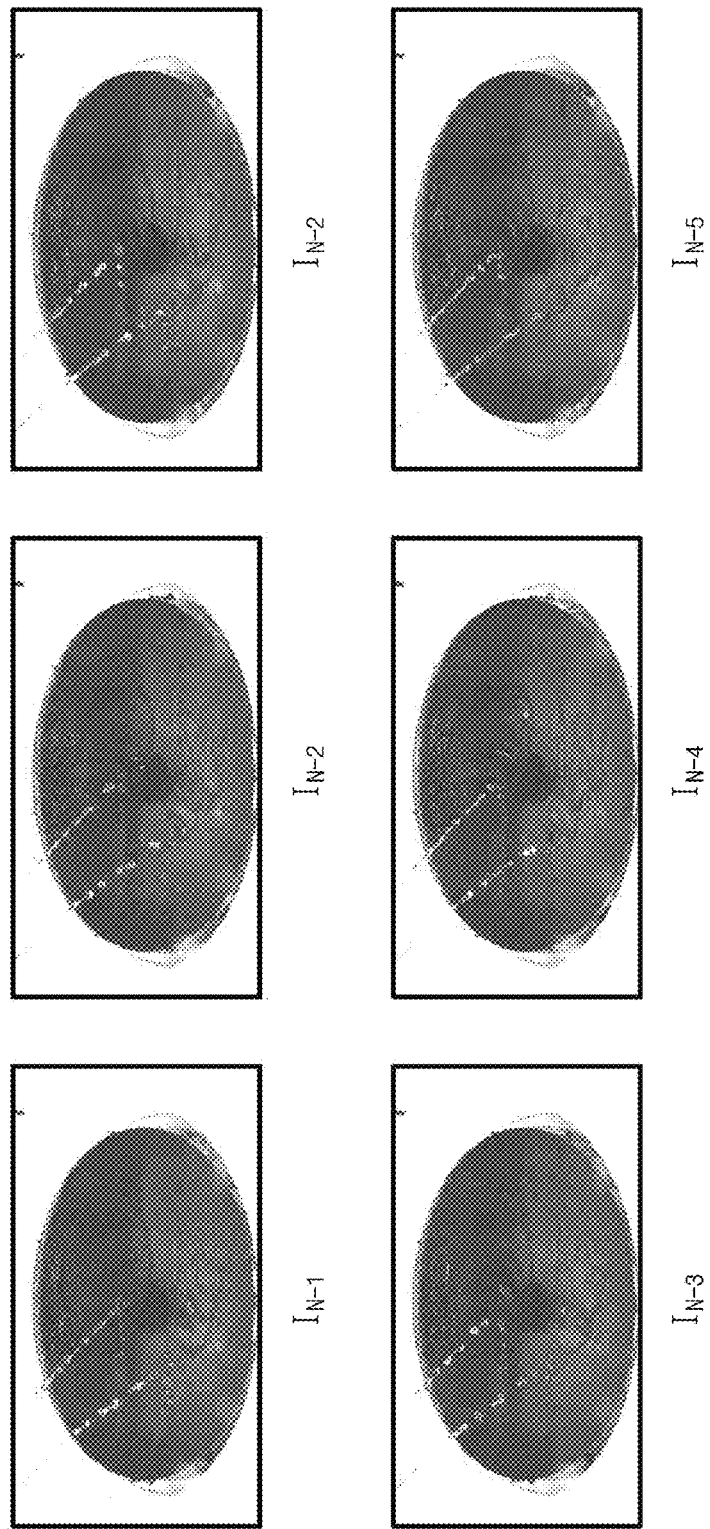
FIGS. 5 to 9 are views illustrating respective operations of inspecting impact points of discharge liquids discharged from a plurality of nozzles.

FIG. 5 is a view illustrating images obtained by continuously capturing a plurality of images by the imaging unit 20 according to an example. Referring to FIG. 5, an example of using six images is illustrated.

Figure 6:
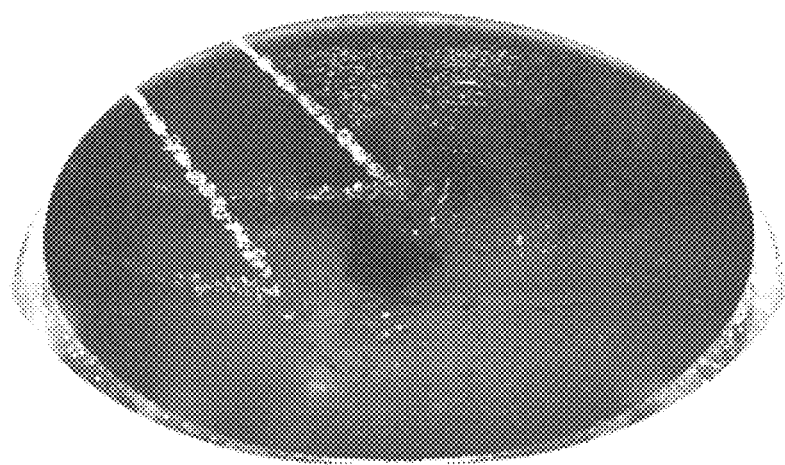

FIG. 6 is a view illustrating a result image obtained by synthesizing the continuously captured images according to the embodiment of FIG. 5. The image synthesizing unit 31 may detect discharge lines of the plurality of nozzles more accurately through the synthesizing of the continuously captured images. Furthermore, the image synthesizing unit 31 may synthesize the images to obtain a maximum brightness value such that the discharge lines may be viewed more clearly. According to an example, an image having the maximum brightness value may be synthesized through the following equation.

$$I_M(i,j) = \text{Max}(I_{N-5}(i,j), I_{N-4}(i,j), \ldots, I_N(i,j))$$

Figure 7:
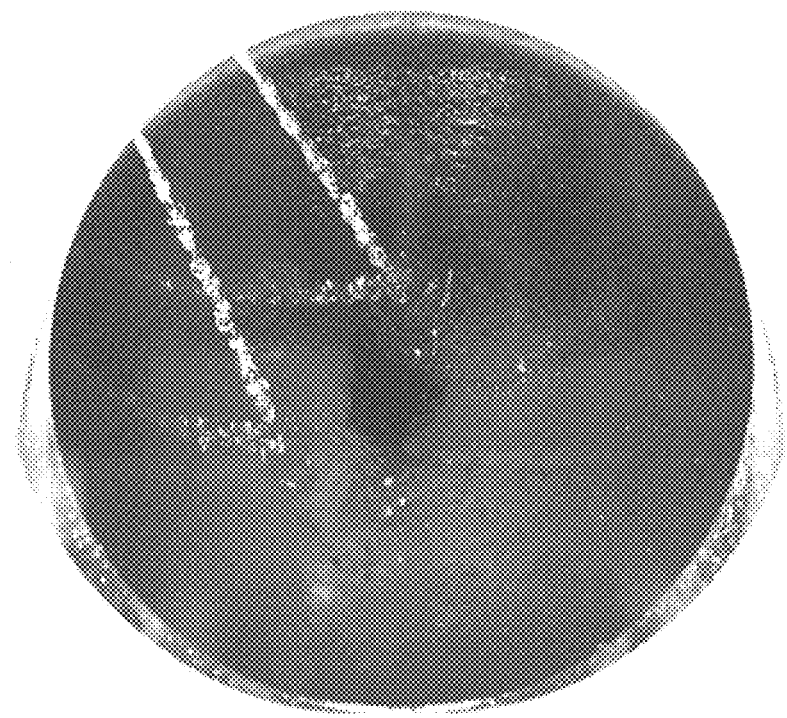

FIG. 7 is a view illustrating a result obtained by performing the distance distortion correction on a result image obtained by synthesizing the continuously captured images according to the embodiment of FIG. 6.

The result image obtained by synthesizing the continuously captured images according to the embodiment of FIG. 6 is not provided such that the shape of the wafer is not circular but elliptical as the imaging unit 20 is disposed obliquely, so that it may be difficult to determine a detailed impact point. Accordingly, the correction for the circular shape may be made to correct a distortion that occurs accordingly.

Figure 8:
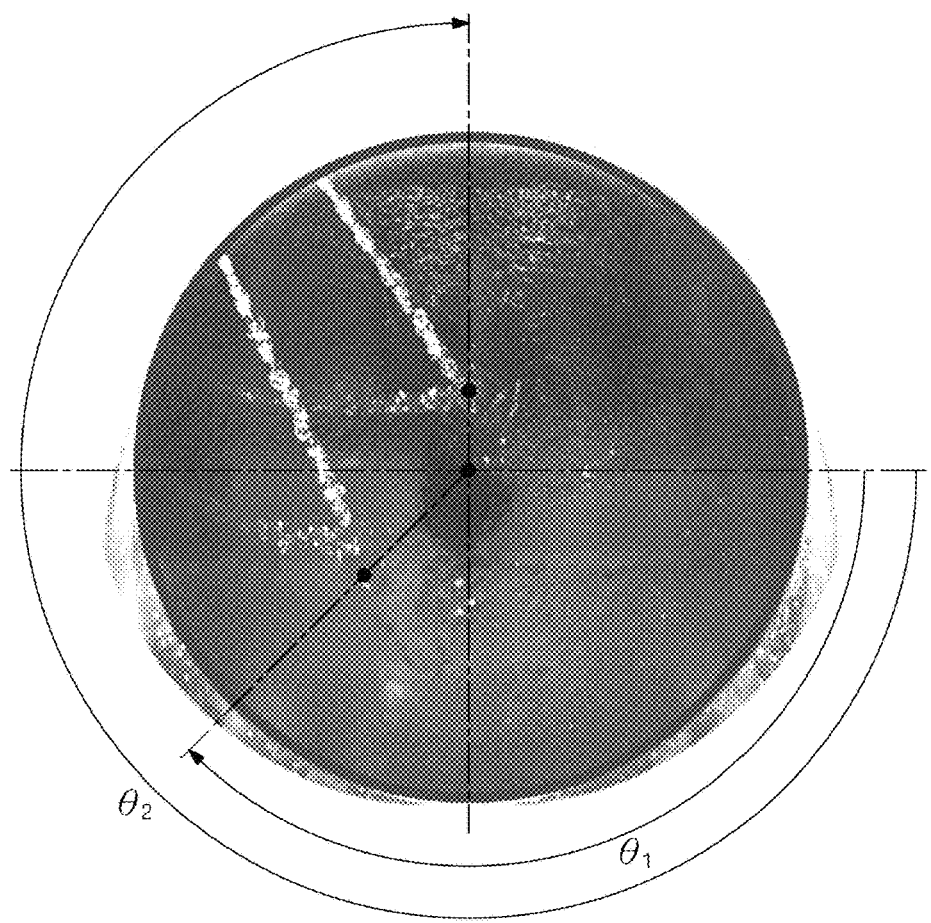

Referring to FIG. 8, because the substrate is corrected in the circular shape when the distance distortion correction is performed, the center point of the substrate may be calculated after the substrate is detected such that the impact point is detected. Furthermore, after the center point is calculated, the coordinate system may be converted into the polar coordinate system According to an example, in the conventional case, the coordinate system is a (x, y) coordinate system, but this may be converted into a (r, θ) coordinate system that is a rectangular coordinate system. This conversion may be made through the following equation.

$$r = \sqrt{x^2 + y^2}$$

$$\theta = \tan^{-1}\left(\frac{y}{x}\right)$$

Figure 9:
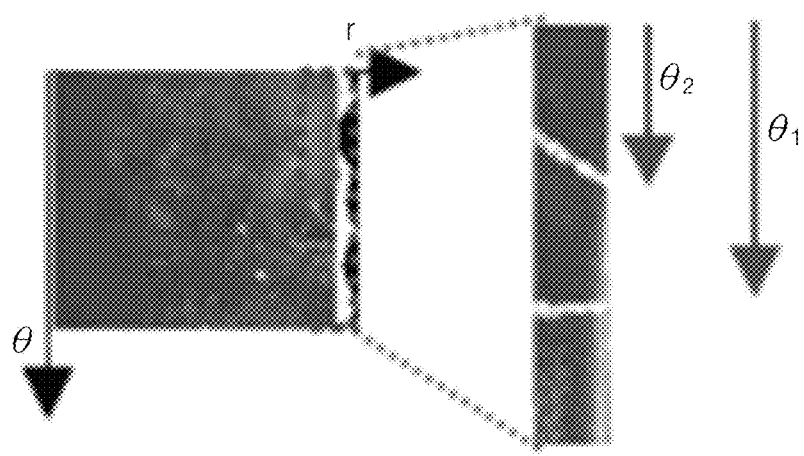

Referring to FIG. 9, according to an example, the (x, y) coordinate system of the final impact points of the discharge liquid discharged from the nozzles may be converted to the (r, θ) coordinate system that is a polar coordinate system. Through this, angle information that is information related to the impact points of the discharge liquids discharged from the nozzles may be derived.

It may be determined whether the impact points are normal by comparing the derived angle information of the nozzles with impact point information depending on the flow information of the nozzles.

According to an example, the impact point information depending on the flow rate information of the nozzles may be as follows.

| | Fix nozzle 2 | | | | |
|---|---|---|---|---|---|
| Flow rate (cc) | 800 | 900 | 1000 | 1100 | 1200 |
| θ2 | 216.7 | 218.6 | 220.5 | 221.3 | 222.8 |
| | Fix nozzle 1 | | | | |
| Flow rate (cc) | 1000 | 1100 | 1200 | 1300 | 1400 |
| θ1 | 240.2 | 241.3 | 242.5 | 243.4 | 245 |

That is, according to the table, angles of the impact points may be changed depending on the flow rates of the nozzles. The calculation unit 33 according to the inventive concept may determine whether the nozzles are normal, by comparing the angles of the impact points of the discharge liquids discharged from nozzle, which are derived from the actually captured images, and the angles of the impact points set depending on the flow rates of the discharged liquids discharged from the nozzles. According to an example, the calculation unit 33 may determine whether the angles of the impact points of the discharge liquids discharged from the nozzles, which are derived from the actually captured images are the same as the angles of the impact points set depending on the flow rates of the discharge liquids discharged from the nozzles, and may determine that the impact points are normal when they are the same, and may determine that the impact points are abnormal when they are not the same. According to another example, the calculation unit 33 may determine whether the angles of the impact points of the discharge liquids discharged from the nozzles, which are derived from the actually captured images correspond to error ranges of the angles of the impact points set depending on the flow rates of the discharge liquids discharged from the nozzles, and may determine that the impact points are normal when they are in the error ranges, and may determine that the impact points are abnormal when they are outside the error ranges. The threshold value ranges set according to the inventive concept may be set by a user in advance. According to an example, the threshold value ranges may correspond to a case in which the angles of the impact points of the discharge liquids discharged from the nozzles, which are derived from the actually captured images are the same as the angles of the impact points, which are set depending on the flow rates of the discharge liquids discharged from the nozzles or are within an error rate range of 1% or less.

According to the inventive concept, the impact points of the nozzles may be inspected regardless of patterns of the substrate.

According to the inventive concept, a process accident due to a change in flow rates and a distortion of nozzles may be prevented in advance by inspecting the impact points of the discharge liquids discharged from the plurality of discharge holes of the fixed nozzle.

The effects of the inventive concept are not limited to the above-mentioned effects, and the unmentioned effects can be clearly understood by those skilled in the art to which the inventive concept pertains from the specification and the accompanying drawings.

It is noted that the above embodiments are suggested for understanding of the inventive concept and do not limit the scope of the inventive concept, and various modifiable embodiments also fall within the scope of the inventive concept. The drawings provided according to the inventive concept merely illustrate an optimum embodiment of the inventive concept. It should be understood that the technical protection range of the inventive concept has to be determined by the technical spirit of the claims, and the technical protection range of the inventive concept is not limited to the lexical meaning of the claims but reaches even to the equivalent inventions.

What is claimed is:

1. A substrate treating apparatus for treating a substrate, the substrate treating apparatus comprising:
   a bowl provided to surround the substrate;
   a nozzle discharging discharge liquid to the substrate drawing parabolas;
   an imaging unit configured to photograph loci of the discharge liquid discharged from the nozzle; and
   an inspection unit configured to:
      convert a coordinate system into a polar coordinate system;
      calculate an impact point of the discharge liquid discharged from the nozzle and determine whether the impact point of the discharge liquid discharged from the nozzle are normal by comparing whether the impact point of the discharge liquid discharged from the nozzle corresponds to threshold values ranges of the nozzle by using data values obtained in the converted polar coordinate system, the threshold value ranges of the nozzles being determined based on flow rate values in the nozzle and location of the loci according to the flow rate values; and
      generate a binarized image of the loci,
   wherein the nozzle protrudes from a basin of the bowl, such that, in a plan view, the nozzle is located outside of the substrate, and
   wherein, in the comparing, the inspection unit compares an angle of the impact point, which is derived from an actually captured image, and an angle of the impact point set depending on the flow rate values in the nozzle.

2. The substrate treating apparatus of claim 1, wherein the inspection unit includes:
   a processor coupled to a memory storing instructions to permit the processor to function as:
      an image synthesizing unit configured to synthesize a plurality of images captured by the imaging unit;
      a pre-processing unit configured to pre-process image data generated through the image synthesizing unit; and
      a calculation unit configured to calculate whether the impact point of the discharge liquid discharged from the nozzle are normal by comparing the image data pre-processed by the pre-processing unit.

3. The substrate treating apparatus of claim 2, wherein the image synthesizing unit synthesizes the plurality of images, and synthesizes a maximum brightness value image of the plurality of images.

4. The substrate treating apparatus of claim 3, wherein the pre-processing unit performs distance distortion correction of the image data generated through the image synthesizing unit.

5. The substrate treating apparatus of claim 4, wherein the pre-processing unit detects a shape of the substrate from the image data, on which the distance distortion correction has been performed, and calculates a center point of the detected shape of the substrate.

6. The substrate treating apparatus of claim 5, wherein the pre-processing unit converts the coordinate system into the polar coordinate system with respect to the center point.

7. The substrate treating apparatus of claim 1, wherein the imaging unit is disposed at a location, at which the substrate is photographed obliquely.

* * * * *